(12) United States Patent
Kim

(10) Patent No.: US 6,774,544 B2
(45) Date of Patent: Aug. 10, 2004

(54) IMAGE DISPLAY APPARATUS

(75) Inventor: Won-nyun Kim, Gwacheon (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/283,137

(22) Filed: Oct. 30, 2002

(65) Prior Publication Data

US 2003/0132710 A1 Jul. 17, 2003

(30) Foreign Application Priority Data

Jan. 16, 2002 (KR) ............................................ 2002-2432

(51) Int. Cl.⁷ .................................................. H01J 1/10
(52) U.S. Cl. ....................... 313/46; 313/477 R; 313/582
(58) Field of Search ............................... 313/44–46, 422, 313/477 R, 495, 498, 573, 634, 582

(56) References Cited

U.S. PATENT DOCUMENTS 5,132,585 A * 7/1992 Kane et al. .................... 313/44
5,971,566 A * 10/1999 Tani et al. ..................... 313/46
5,990,618 A * 11/1999 Morita et al. ................ 313/582
6,288,489 B1 * 9/2001 Isohata et al. ............... 313/582

* cited by examiner

Primary Examiner—Ashok Patel
(74) Attorney, Agent, or Firm—Sughrue Mion, PLLC

(57) ABSTRACT

An image display apparatus to equalize a temperature of a panel, such as a plasma display panel, LCD or the like. A radiating plate has a heat transmission unit for equalizing a surface temperature of the image display unit. The heat transmission unit uses a loop heat pipe. The loop heat pipe has a small amount of operation fluid inside, the inside of the loop heat pipe being under vacuum. The loop heat pipe circulates heat emitted from the image display unit to equalize the temperature of the image display unit. Accordingly, the partial damage to the panel caused by the high temperature heat generated from the panel can be prevented, and the life span of the panel can be extended. The equalized temperature of the panel can reduce a brightness difference between the upper and lower ends of the panel.

19 Claims, 4 Drawing Sheets

(b) With back cabinet

IMAGE DISPLAY APPARATUS

BACKGROUND OF THE INVENTION

1. Field of the Invention

The present invention relates to an image display apparatus, and more particularly, to an image display apparatus comprising a temperature-equalizing device for equalizing a temperature of a panel. The present application is based on Korean Patent Application No. 2002-0002432, filed Jan. 16, 2002, which is incorporated in full by reference herein.

2. Description of the Prior Art

A plasma display panel (PDP) is a panel made of two base plates of glass which are fixed to each other in an air-tight manner. The PDP displays an image by utilizing a gas discharge phenomenon and requires a relatively simple fabrication process. Using a PDP, it is also easy to make a large and thin display screen. The PDP emits a large amount of heat during the operation due to the gas discharge phenomenon. Most of the PDPs have a radiating apparatus that uses a fan and is disposed at a rear end of the panel, for releasing the heat outwardly.

FIG. 1 is a cross sectional view showing an interior of a PDP having a conventional radiating apparatus.

Referring FIG. 1, a PDP 100 having a conventional radiating apparatus comprises a filter 110, a panel 120, a radiating plate 130, a radiating fan 140, a front casing 150 and a rear casing 160. The filter 110 protects an image display apparatus such as the panel 120 from an external shock. The filter 110 mainly uses glass. The panel 120 consists of two base plates of glass formed typically with a gap of approximately 0.1 mm therebetween. The gap between the two base plates is under vacuum, and there occurs a gas discharge phenomenon in the gap. Accordingly, the PDP 100 displays an image by utilizing the gas discharge phenomenon that occurs in the vacuous gap.

On a rear surface of the panel 120 is provided the radiating plate 130 for equalizing a temperature of the panel 120. The radiating plate 130 uses metallic plate of a high thermal conductivity such as aluminum. At a rear surface of the radiating plate 130 is provided at least one radiating fan 140 for cooling the panel 120 during the operation of the PDP 100.

That is, when the PDP 100 is driven, heat is generated inside the panel 120 due to the gas discharge phenomenon. Most of the generated heat is conducted to the radiating plate 130 disposed at the rear surface of the panel 120. The radiating fan 140 circulates inner air of the PDP 100 to cool the radiating plate 130. When the PDP 100 does not include the radiating fan 140, the radiating plate 130 is cooled by a natural convection caused by a temperature difference.

FIG. 1 shows the front casing 150 in a thick solid line and the rear casing 160 in a dotted line. The front casing 150 is disposed at a front surface of the PDP 100 where the filter 110 is disposed and the rear casing 160 is typically disposed at a rear surface of the PDP 100 where the radiating fan 140 is disposed, thereby protecting the PDP 100 from an external shock.

However, power that is consumed for driving the PDP 100 is converted to heat and discharged outwardly. The heat emitted from the PDP 100 heats the PDP 100 and ambient air of the PDP 100, causing a convection phenomenon. A boundary layer is formed around the PDP 100 due to the convection phenomenon. The boundary layer typically needs to be made gradually thicker towards its upper end, and the upper end of the boundary layer has a higher temperature during operation of the PDP 100 than a lower end of the boundary layer. Another main reason that the upper end has a higher temperature than the lower end is that an exhaust operation is not smoothly performed due to the presence of the rear casing 160.

FIG. 2 is an isothermal line showing a temperature distribution of the panel when the PDP is driven.

Referring to FIG. 2, the temperature distribution is irregular when the PDP 100 is driven and there is a great temperature difference between the upper end and the lower end. The temperature difference increases as the panel 120 is enlarged in size.

The temperature difference of the panel 120 shortens a life span of the PDP 100, and the upper end and the lower end have different capacities such that an even quality of image cannot be obtained. With a larger size PDP 100 especially, the temperature difference between the upper end and the lower end of the panel 120 increases. Also, there is a limit on the ability to equalize the temperature of the panel 120 with the radiating plate 130 and the radiating fan 140. Also, since the PDP 100 comprises the radiating fan 140 for cooling the PDP 100, it is difficult to make the PDP 100 thinner. Additionally, power consumption is increased, and there is a problem of noise.

SUMMARY OF THE INVENTION

The present invention has been developed in order to solve the above problems in the prior art. Accordingly, an object of the present invention is to provide an image display apparatus comprising a temperature-equalizing device for equalizing a temperature of a panel.

The object is achieved by providing an image display apparatus comprising: an image display unit for displaying an image on a screen; and a radiating plate having a heat transmission unit for equalizing a surface temperature of the image display unit by circulating heat emitted from the image display unit.

More specifically, the heat transmission unit is a loop heat pipe, and the loop heat pipe has a small amount of operation fluid injected into an inside thereof, the inside of the loop heat pipe being under vacuum. The heat transmission unit is shaped in a closed loop and is disposed around an edge of the radiating plate. The heat transmission unit is shaped in a closed loop and is formed in a zigzag fashion.

According to the present invention, the image display apparatus is provided with the loop heat pipe, such that the temperature of the panel is equalized. Accordingly, the life span of the image display apparatus can be extended, and the equalized temperature of the panel can reduce a brightness difference that is caused by the temperature difference.

BRIEF DESCRIPTION OF THE DRAWINGS

The above object and a feature of the present invention will become more apparent by description of a preferred embodiment of the present invention in greater detail with reference to the accompanying drawing, in which.

DETAILED DESCRIPTION OF THE PREFERRED EMBODIMENT

Hereinafter, the present invention will be described in greater detail with reference to the accompanying drawings.

Figure 1:
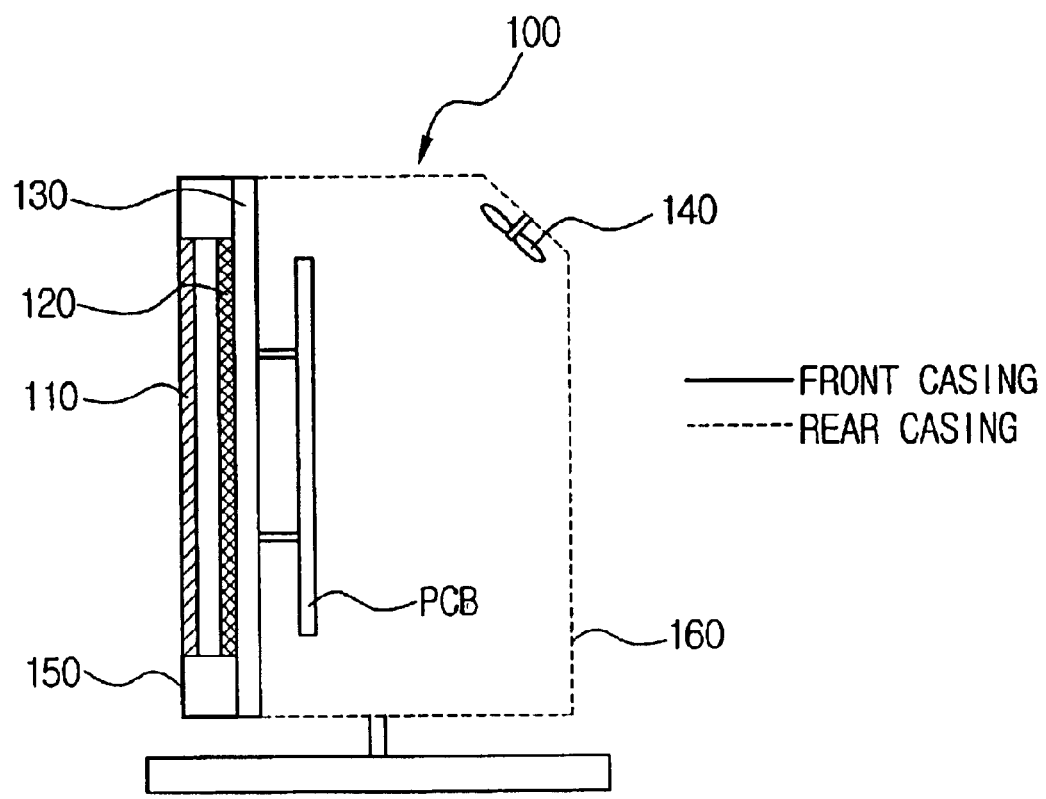
FIG. 1 is a cross sectional view showing an interior of a PDP comprising a conventional radiating apparatus.
Figure 2:
FIG. 2 is an isothermal line showing a temperature distribution of a panel when a PDP is driven.
Figure 3:
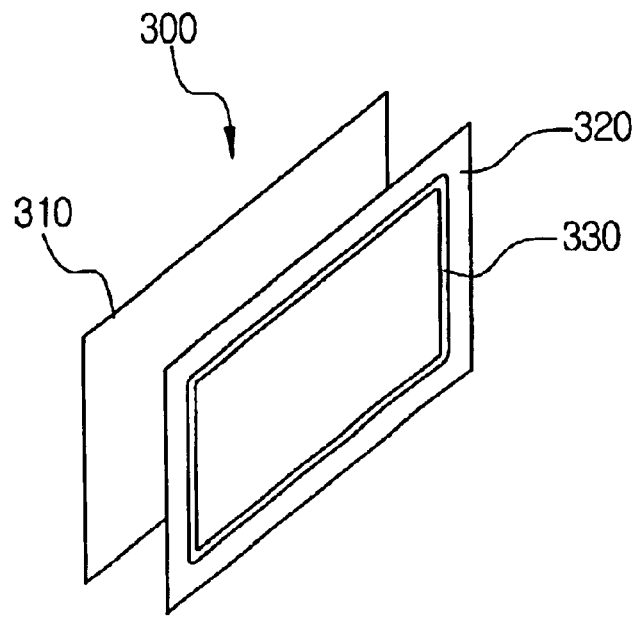
FIG. 3 is a view showing a basic structure of an image display apparatus according to a preferred embodiment of the present invention.

FIG. 3 is a view showing a basic structure of an image display apparatus according to a preferred embodiment of the present invention.

Referring to FIG. 3, an image display apparatus 300 according to the present invention comprises an image display unit 310, a radiating plate 320, and a heat transmission unit 330. The image display unit 310 uses a plasma display panel (PDP) or a liquid crystal display (LCD) or an other type of flat panel display now known or in the future discovered suitable for use with the present invention. The image display unit 310 according to the present invention uses a PDP for example.

The radiating plate 320 is attached to a rear surface of the PDP 310. The radiating plate 320 is typically made of metallic material such as aluminum that has a high thermal conductivity. On the radiating plate 320 is provided the heat transmission unit 330. The heat transmission unit 330 uses a loop heat pipe 330. As shown in FIG. 3, the loop heat pipe 330 forms a closed loop and is disposed around an edge of the radiating plate 320.

Figure 4:
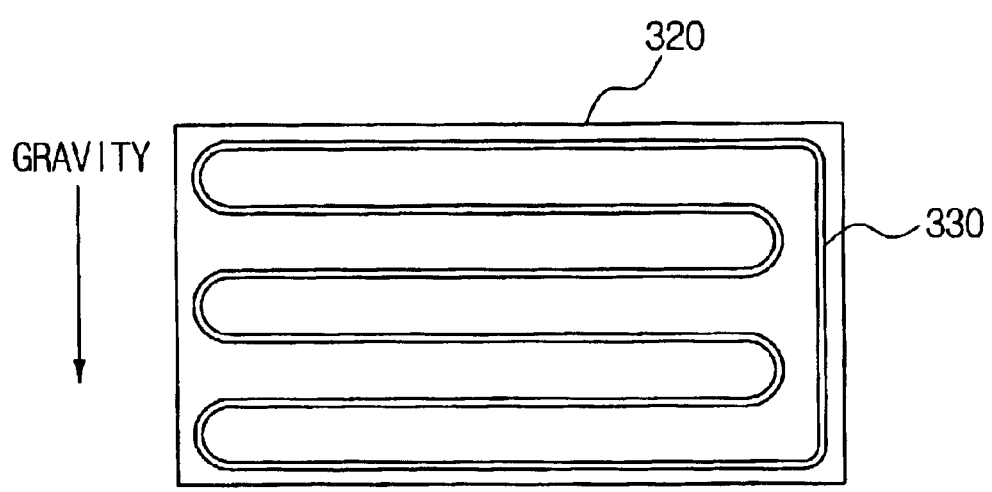
FIG. 4 is a view showing a radiating plate comprising a loop heat pipe according to a preferred embodiment of the present invention.

It is preferred that the loop heat pipe 330 is formed symmetrically with respect to a vertical and horizontal center lines of the radiating plate 320. The loop heat pipe 330 can be shaped in a circle, an ellipse, or a polygon such as a triangle and a square. Also, as shown in FIG. 4, the loop heat pipe 330 can be formed all over the radiating plate 320 in a zigzag fashion. The zigzag fashion of the loop heat pipe 330 allows the PDP 310 to be protected from an external shock and helps the loop heat pipe 330 and the PDP 310 to have a regular temperature. The zigzag pattern shown in FIG. 4 is but one illustrative type of many zigzag patterns that may be used. The zigzag pattern of FIG. 4 is not symmetrical with respect to both the horizontal and vertical center lines of the radiating plate 320.

The loop heat pipe 330 is a heat transmission apparatus that moves a large amount of heat by utilizing latent heat evaporated from an operation fluid (sometimes called a working fluid) in the loop heat pipe 330 even with a small temperature difference and regardless of the gravity direction. The operation fluid uses material such as distilled water or an other suitable liquid that is phase-changeable according to the temperature. An inside of the loop heat pipe 330 is under vacuum.

Figure 5:
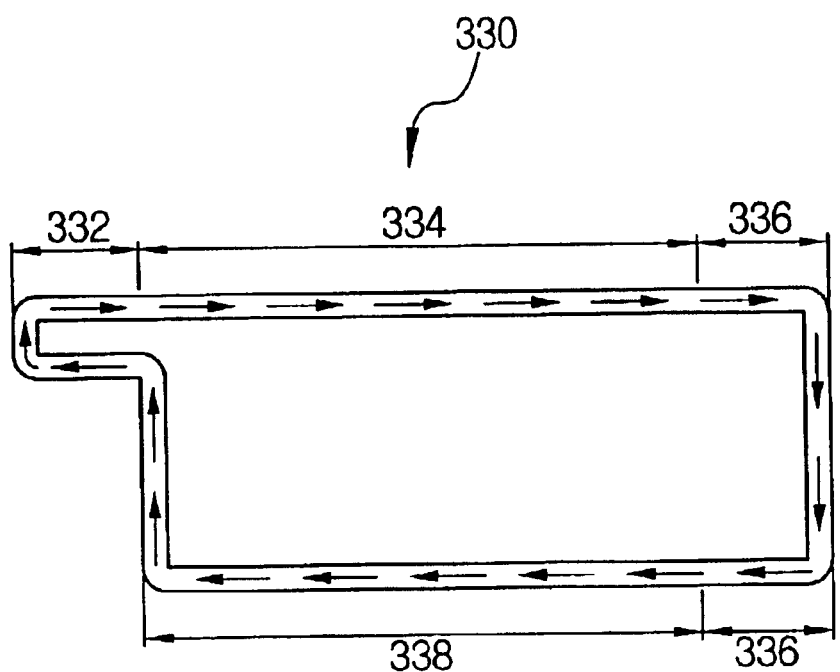
FIG. 5 is a view showing a general loop heat pipe according to the present invention to explain the operation of the loop heat pipe.

FIG. 5 is a view showing a general loop heat pipe used in the present invention to explain the operation of the loop heat pipe.

Referring FIG. 5, the loop heat pipe 330 is mainly divided into an evaporator 332, a first adiabatic section 334, a condenser 336 and a second adiabatic section 338.

When the image display apparatus 300 is driven, the PDP 310 emits heat. For the same reason as described above, the upper end of the PDP 310 has a higher temperature than the lower end. That is, the upper end of the PDP 310 becomes a heat source of the loop heat pipe 330. At this time, it is preferred that the operation fluid is placed at an opposite position to the heat source.

The heat source is disposed in the evaporator 332, and a small amount of the operation fluid injected into the evaporator 332 boils with the heat emitted from the upper end of the PDP 310, i.e., the heat source. Since the loop heat pipe 330 is under vacuum, the operation fluid is easy to boil even with a little temperature difference. The operation fluid evaporated by the heat source spreads inside the loop heat pipe 330.

The evaporated operation fluid passes the first adiabatic section 334, and emits the heat and is condensed at the condenser 336. The liquefied operation fluid after the condensation passes the second adiabatic section 338 and returns to the evaporator 332 that has the heat source. By the repeat of evaporation and condensation of the operation fluid by the heat source, the heat is transmitted. That is, the operation fluid repeats circulating in the loop heat pipe 330 through the repeated evaporation and liquefaction by the heat source.

When the operation fluid reaches the boiling point, the liquid and vapor of the operation fluid maintains an equal temperature. The liquid and vapor is changed and moved at a high speed in the loop heat pipe 330. Accordingly, the loop heat pipe 330 maintains the equal inner temperature due to the speedy movement of the liquid and vapor of the operation fluid. By making use of the loop heat pipe 330, the surface temperature of the PDP 310 is equalized. Also, the operation fluid moves at the high speed such that the PDP 310 maintains the equalized temperature without an extreme temperature change.

Also, the loop heat pipe 330 is less subjected to the effect of gravity, thereby transmitting the evaporated operation fluid to a long distance. Since the loop heat pipe 330 is able to transmit the heat in a direction opposing to the gravity direction, which differs from a general heat pipe, it is also able to transmit the heat from the upper end to the lower end. Accordingly, even with the PDP 310 being enlarged and the loop heat pipe 330 having a long length, the operation fluid maintains its heat transmission rate, and thus, the enlarged PDP 310 can have the temperature equalized.

According to the present invention, the image display apparatus that uses a panel such as the PDP or the LCD or the like is provided with the loop heat pipe, such that the extreme temperature difference between the upper and lower ends of the panel is reduced and the temperature of the panel is equalized. Of particular importance, the partial damage to the panel that may be caused by the high temperature heat generated from a certain part of the panel can be prevented, and accordingly, the life span of the panel can be extended. The equalized temperature of the panel can reduce a brightness difference between the upper and lower ends of the panel.

Although the preferred embodiment of the present invention has been described, it is understood that the present invention is not be limited to this preferred embodiment but various changes and modifications can be made by one skilled in the art within the spirit and scope of the present invention as hereinafter claimed.

What is claimed:

1. An image display apparatus comprising:
    an image display unit for displaying an image on a screen; and
    a radiating plate having a heat transmission unit for equalizing a surface temperature of the image display unit by circulating heat emitted from the image display unit.

2. The image display apparatus of claim 1, wherein the heat transmission unit is a loop heat pipe.

3. The image display apparatus of claim 2, wherein the loop heat pipe has inside a small amount of operation fluid, the inside of the loop heat pipe being under vacuum.

4. The image display apparatus of claim 1, wherein the heat transmission unit is shaped in a closed loop and is disposed around an edge of the radiating plate.

5. The image display apparatus of claim 1, wherein the heat transmission unit is shaped in a closed loop and is formed in a zigzag fashion.

6. The image display apparatus of claim 1, wherein the heat transmission unit is an active heat transmission unit.

7. The image display apparatus of claim 2, wherein the loop heat pipe is formed symmetrically with respect to a vertical and horizontal center lines of the radiating plate.

8. An image display apparatus comprising:

an image display unit for displaying an image on a screen; and a radiating plate having a heat transmission unit, wherein the heat transmission unit equalizes a surface temperature of the image display unit by circulating heat emitted from the image display unit.

9. The image display apparatus of claim 8, wherein the heat transmission unit is a loop heat pipe.

10. The image display apparatus of claim 9, wherein the loop heat pipe has inside a small amount of operation fluid, the inside of the loop heat pipe being under vacuum.

11. The image display apparatus of claim 9, wherein the loop heat pipe is formed symmetrically with respect to a vertical and horizontal center lines of the radiating plate.

12. The image display apparatus of claim 8, wherein the heat transmission unit is shaped in a closed loop and is disposed around an edge of the radiating plate.

13. The image display apparatus of claim 8, wherein the heat transmission unit is shaped in a closed loop and is formed in a zigzag fashion.

14. An image display apparatus comprising:

an image display unit for displaying an image on a screen; and a radiating plate having a heat transmission unit for equalizing a surface temperature of the image display unit by circulating heat emitted from the image display unit, wherein the heat transmission unit is shaped in a loop.

15. The image display apparatus of claim 14, wherein the heat transmission unit is a loop heat pipe.

16. The image display apparatus of claim 15, wherein the loop heat pipe has inside a small amount of operation fluid, the inside of the loop heat pipe being under vacuum.

17. The image display apparatus of claim 14, wherein the heat transmission unit is shaped in a closed loop and is disposed around an edge of the radiating plate.

18. The image display apparatus of claim 14, wherein the heat transmission unit is shaped in a closed loop and is formed in a zigzag fashion.

19. The image display apparatus of claim 14, wherein the heat transmission unit is shaped in a loop that is formed symmetrically with respect to a vertical and horizontal center lines of the radiating plate.

* * * * *